United States Patent [19]

Minato et al.

[11] Patent Number: 4,616,243

[45] Date of Patent: Oct. 7, 1986

[54] GATE PROTECTION FOR A MOSFET

[75] Inventors: Osamu Minato, Nishitama; Toshio Sasaki, Hachioji; Toshiaki Masuhara, Nishitama, all of Japan

[73] Assignee: Hitachi, Ltd., Tokyo, Japan

[21] Appl. No.: 621,682

[22] Filed: Jun. 18, 1984

[30] Foreign Application Priority Data

Jun. 17, 1983 [JP] Japan .................. 56-107678

[51] Int. Cl.[4] ........................................... H01L 29/78
[52] U.S. Cl. ................................. 357/23.13; 357/86; 357/49; 357/47; 357/42
[58] Field of Search ............... 357/86, 23.13, 49, 47, 357/42, 23.14

[56] References Cited

U.S. PATENT DOCUMENTS

| | | | |
|---|---|---|---|
| 3,517,280 | 6/1970 | Rosier | 357/86 X |
| 3,673,428 | 6/1972 | Athanas | 357/420 X |
| 3,712,995 | 1/1973 | Stuedel | 357/23.13 X |
| 3,967,295 | 6/1976 | Stewart | 357/23.13 X |
| 4,131,908 | 12/1978 | Daub et al. | 357/23.13 X |
| 4,152,717 | 5/1979 | Satou et al. | 357/86 X |
| 4,489,340 | 12/1984 | Ueda et al. | 357/86 X |
| 4,509,069 | 4/1985 | Stoisiek | 357/86 X |

Primary Examiner—Martin H. Edlow
Assistant Examiner—William Mintel
Attorney, Agent, or Firm—Antonelli, Terry & Wands

[57] ABSTRACT

This invention relates to a protection device of a semiconductor device. The present invention can prevent the drop of a gate breakdown voltage due to miniaturization of a device without impeding the high speed performance of the circuit attached thereto. The invention improves the voltage that can be applied to the input terminal of the device by reducing the surface breakdown voltage of a surface breakdown type MOS transistor, which is a principal member of a protection device, and reducing the resistance after the breakdown. This can be accomplished, for example, by increasing the concentration of a region in which the MOS transistor is disposed, by reducing the depth of the region, and so forth.

6 Claims, 11 Drawing Figures

GATE PROTECTION FOR A MOSFET

BACKGROUND OF THE INVENTION

This invention relates generally to a semiconductor device and more particularly, to a protection device in a metal insulator semiconductor (MIS) device such as an insulated gate field effect transistor (hereinafter called an "MOS transistor").

The construction and operation of a protection device in an MOS device will now be described with reference to FIGS. 1A and 1B.

In FIG. 1A, reference numeral 1 represents an input terminal, and reference numeral 2 represents a clamp resistance which is ordinarily composed of a diffusion layer or a polysilicon layer. Reference numeral 3 represents a surface breakdown type MOS transistor having the gate 4 thereof kept at a ground potential, and reference numeral 5 represents its drain. The drain terminal 5 is connected to the gate terminal 6 of an MOS transistor to be protected. As the voltage to be applied to the drain 5 is gradually increased in this circuit construction, an electric field crowds between the drain and the gate and finally, electrical breakdown occurs at the surface of the semiconductor substrate under the gate of the MOS transistor. After the breakdown, the current flows from the drain 5 to the ground through the substrate, and is limited by the resistance of the substrate.

Reference numerals 8 and 9 represent the drain and source of an MOS transistor 7. Generally, the surface breakdown voltage of the MOS transistor 3 is about 15 V.

As prior art references relating to gate protection, mention can be made of U.S. Pat. Nos. 3,555,374 and 3,999,212.

FIG. 1B shows the sectional structure of the protection device 101 shown in FIG. 1A. In the drawing, reference numeral 10 represents a p-type substrate, 12 is the input terminal 1 in FIG. 1A, and 102 is a clamp resistance formed by n+diffusion. The MOS transistor represented by reference numeral 3 has a gate 17 consisting of polysilicon and drain and source consisting of n+-type diffusion layers 15, 16. The members 17 and 16 are connected to the ground 18 while the member 15 is connected to the output 14 of a diffusion resistance 102, and hence to the gate of the active MOS device. Reference numeral 19 represents the gate oxide of the MOS transistor 3, and its structure and thickness are the same as those of the gate oxide of the active MOS device. Reference numeral 11 represents a thick insulation film for separating the devices.

The operation of the protection device will be explained for a case in which the gate oxide film 19 is 500 Å thick, the breakdown voltage of the oxide film is 25 V, the surface breakdown voltage of the MOS transistor 3 is 15 V, a supply voltage of 5 V is applied to the drain 8 of the active MOS transistor 7, and its source is at the ground potential.

When a positive voltage is applied to the input terminal 1 and the voltage at the input terminal 5 of the active MOS device is above 15 V, the MOS transistor 3 undergoes breakdown, and a current flows through the ground terminal. If the resistance is 100 Ohms and the resistance 2 is 2 K Ohms after this breakdown, the voltage at which the gate insulation film of the active MOS device undergoes breakdown, that is, the input terminal voltage at which the voltage of the terminal 5 reaches 25 V, is found to be about 220 V by measurement.

When a negative voltage is applied to the input terminal 1, on the other hand, the p-type substrate 10 and the n+-type diffusion layer 102 are a forward biased diode if the p-type substrate 10 is at the ground potential. Therefore a voltage applied to the gate oxide film 19 will not exceed a constant voltage of 0.6 V.

As described above, the protection device of the prior art exhibits a desirable effect in that the breakdown of the gate insulation film of the active MOS device is prevented. When it is used actually as one of the constituents for an IC (integrated circuit) or an LSI (large scale integrated circuit), however, various problems are encountered.

The first problem is as follows. The higher the value of the clamp resistance 2, the higher its effect because the clamp resistance 2 prevents the breakdown of the gate insulation film of the active MOS device by a high surface voltage applied thereto from outside. As shown in FIG. 2, however, the clamp resistance 2 is made of the same n+-type diffusion layer as that forming the drain and source of the active MOS device, and its value is kept as low as possible in order not to deteriorate various characteristics of the active MOS device. When the value of the clamp resistance 2 is increased, therefore, the area of the resistance itself becomes greater.

The second problem is as follows. An external clock signal is applied to the input terminal 1 or to the input terminal 20 in FIG. 2. In ICs or LSIs in general, a signal having a TTL (Transistor-Transistor Logic) level or a low level of from 0 to 0.8 V and a high level of from 2.2 to 5 V is applied.

However, a clock pulse having a voltage swing, whose low level is below 0 V, e.g., from about −3 to about −5 V, and is below the potential (0 V) of the substrate 10, (clock signal having so-called "undershoot") is applied from time to time depending upon the kind of the system to be employed. In this case, a parasitic bipolar device, which uses the source or drain formed by the n+-type diffusion layer of the active MOS device as its collector, the p-type substrate as its base, and the resistance formed by the n+-type diffusion layer as its emitter, operates. Although this parasitic operation is only temporary, if the active device is one of the elements of memory cells and the drain forms a storage node in this case, the stored data are destroyed.

The above is disclosed in Japanese Utility Model Laid-Open No. 188,364/1982, for example.

FIG. 2 shows one of the improved inventions made by the inventors of the present invention.

FIG. 2 shows the sectional structure of the protection device 101 in FIG. 1A and that of the internal circuit MOS transistor portion 102 to be protected. A CMOS structure is used by way of example. In the drawing, reference numeral 20 represents the input terminal, 21 is the clamp resistance, and 22 is a terminal which transmits a signal to the gates 33 and 34 of the internal circuit. The MOS transistor 3 in FIG. 1A is composed, in FIG. 2, of a gate 32, drain and source 23, 24 consisting of the n+-type diffusion layer, and a p-type well 35 formed on the N-type substrate 37 as its substrate. The p-type diffusion layer 28 is kept fixed at the ground potential together with the gate and source 32, 24, and the drain 23 is connected to the terminal 22.

On the other hand, the active circuit 102 consists of a p-channel MOS transistor 44 whose source and drain are formed by the p-type diffusion layers 29, 30 and whose gate is represented by reference numeral 33, and an n-channel MOS transistor whose drain and source are formed by the n-type diffusion layers 26, 27 and whose gate is represented by reference numeral 34. The p-type well 36 is kept fixed at the ground potential through the p-type diffusion layer 31 together with the source 27, while the n-type substrate 37 is kept fixed at a power source ($V_{cc}$) potential through the n-type diffusion layer 25 together with the source 29, with their drains 30 and 26 being connected to each other to form a so-called "CMOS inverter circuit".

Reference numeral 38 represents the gate insulator film (e.g., oxide film) of the MOS transistor 43, and its structure and thickness are the same as those of the gate insulator films 39, 40 of the active MOS transistors. The concentration and depth of the p-type well 35 are also the same as those of the p-type well 36 of the active MOS transistor 45.

The operation of the protection device will now be described with reference to the case in which the gate oxide films 38, 39 and 40 are 500 Å thick, their breakdown voltage is 25 V, the surface breakdown voltage of the MOS transistor 43 formed by the drain 23, source 24 and gate 32 is 15 V, a power source voltage of 5 V is applied to the drain 41 of the active MOS transistor 45 and its source 27 is at the ground potential.

When a positive voltage is applied to the input terminal 20 and the voltage at the input terminal 22 of the active MOS transistor is above 15 V, the MOS transistor 43 undergoes breakdown, and a current flows through the ground terminal. If the resistance is 100 Ohms and the value of the clamp resistance 21 is 2 K Ohms after this breakdown, the voltage at which the gate of the active MOS transistor undergoes breakdown, that is, the value of the input terminal voltage necessary for the voltage of the terminal 22 to rise to 25 V, is found to be about 220 V by measurement.

On the other hand, when a negative voltage is applied to the input terminal 20, the member 35 and the n$^+$-type diffusion layer 23 are in diode connection in the forward direction if the p-type well 35 is at the ground potential. Therefore a voltage applied to the gate oxide films 39, 40 of the transistors 44, 45 will not exceed a constant voltage of about −0.6 V.

As described above, the protection device shown in FIG. 2 exhibits the desirable effect in preventing the breakdown of the gate insulator film of the active MOS transistor. When it is used in practice as one of the elements of an IC or an LSI, however, the following various problems are encountered.

The first problem is as follows. When the size of the MOS transistor is reduced, the gate insulator film must essentially be made thinner in order to sufficiently improve the transistor characteristics. However, when this is done the voltage value at which the gate of the active MOS transistor undergoes breakdown also drops. When the gate oxide film is made thinner, the surface breakdown voltage of the MOS transistor 43 tends to be reduced and this contributes to improving the breakdown voltage of the gate oxide film. However, it is obvious that the value of the breakdown voltage of the gate oxide film as viewed from the input terminal is lower than that of the prior art.

The second problem is as follows. High speed performance has been required recently for ICs and LSIs using MOS transistors, and examination has been made to improve the high speed performance of active circuits. In this sense, the delay time of an R-C circuit consisting of parasitic capacitance of the clamp resistance 21 and a wiring 22 interposed between the input terminal 20 and the transistor 43 has become a critical problem. When the value of the breakdown voltage of the gate oxide film as viewed from the input terminal is to be increased, the value of the clamp resistance 21 must be increased unavoidably, so that the delay time becomes greater and the high speed performance of the circuit is lost.

SUMMARY OF THE INVENTION

It is an object of the present invention to provide a protection device of an MIS device which eliminates the problems with the structure of the prior art described above.

It is another object of the present invention to prevent the drop of the gate breakdown voltage due to miniaturization of devices.

It is still another object of the present invention to increase the gate breakdown voltage without extending an R-C delay time.

The fundamental concept of the present invention is as follows. The present invention pays specific attention to a surface breakdown type MOS transistor (MOS transistor 43 in FIG. 2) forming the protection device, and drastically improves the gate breakdown voltage, as viewed from the input terminal, by reducing the breakdown voltage of the MOS transistor and reducing the resistance after the breakdown.

The object described above can be accomplished by increasing the concentration of the region, where the surface breakdown type MOS transistor is to be disposed, or by decreasing its depth relative to other regions where MOS transistors are formed

DESCRIPTION OF THE PREFERRED EMBODIMENTS

Hereinafter, some preferred embodiments of the invention will be described with reference to the accompanying drawings. In the embodiments to follow, semiconductor devices relating to a surface breakdown type MOS transistor will be described in view of the object of the invention.

EMBODIMENT 1

Figure 1A:
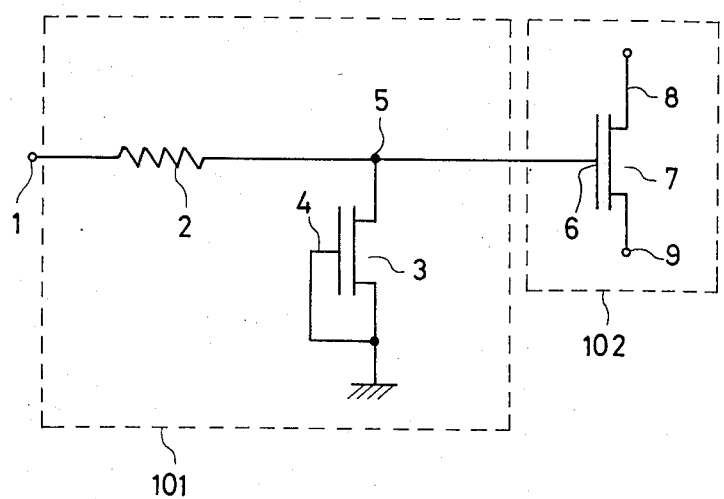
FIG. 1A is a circuit diagram of a protection device for an MIS device.
Figure 1B:
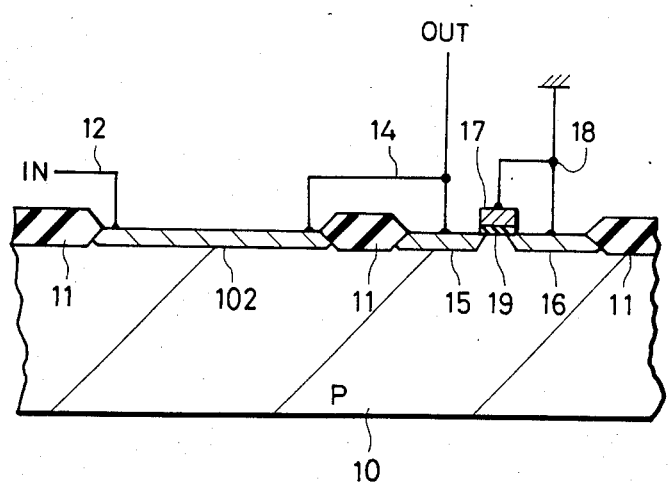
FIG. 1B is a cross-sectional view of a protection device of the prior art.
Figure 2:
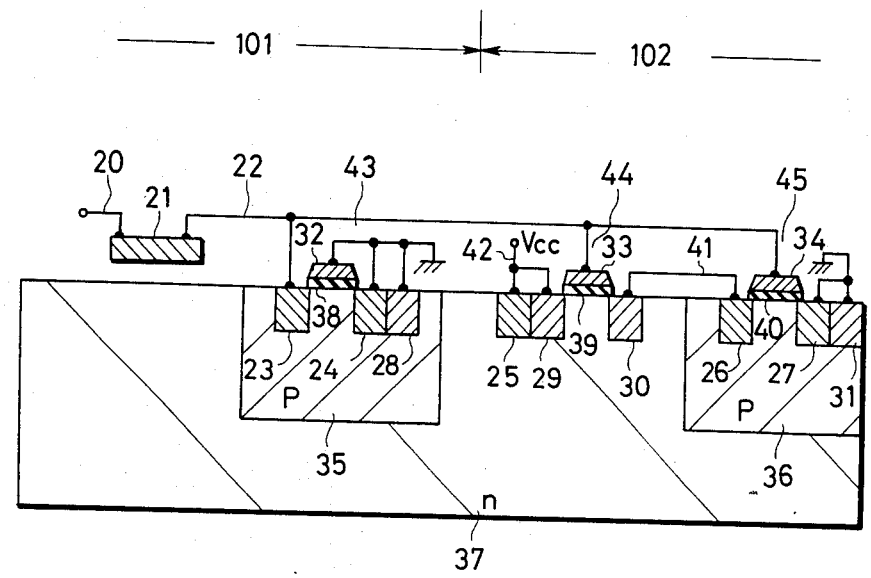
FIG. 2 is a cross-sectional view of an improved protection device made by the present inventors.
Figure 3:
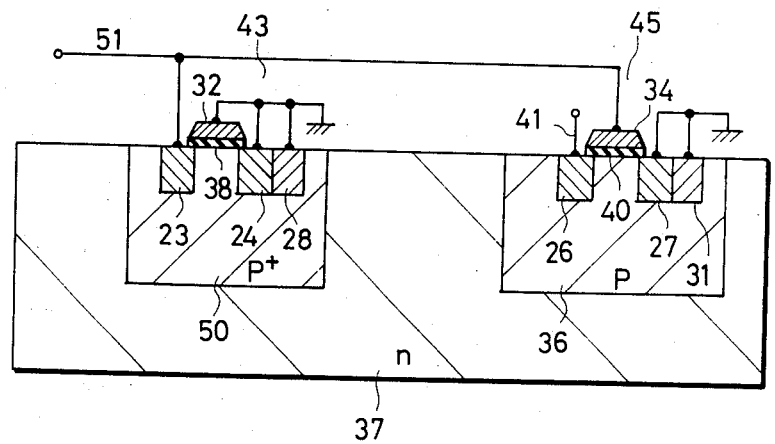
FIG. 3 is a cross-sectional view of a first embodiment of the present invention.

FIG. 3 shows the cross-sectional structure of a semiconductor device in accordance with the first embodiment of the present invention. In the drawing, reference numeral 50 represents a p-type well, and reference numeral 51 does a signal transmission terminal (internal terminal) through a resistance. Like reference numerals are used to identify the other constituents which are the same as, or analogous to, those in FIG. 2. Incidentally, the channel MOS transistor 44 is omitted from the drawing, but it is disposed in practice inside the n-type substrate 37 as shown in FIG. 2.

The characterizing feature of this embodiment resides in that the MOS transistor represented by 43 in FIG. 2 is disposed inside the p-type well represented by 50 in FIG. 3. Unlike the p-type wells 35 and 36 shown in FIG. 2, the carrier concentration of this p-type well 50 is by about five to ten times higher, and the sheet resistance is also lower. When the carrier concentration of the substrate is about $10^{15}/cm^3$, for example, the carrier concentration of the region 36 is from about $10^{15}$ to about $10^{16}/cm^3$, and that of the region 50, at least $10^{17}/cm^3$.

Figure 4:
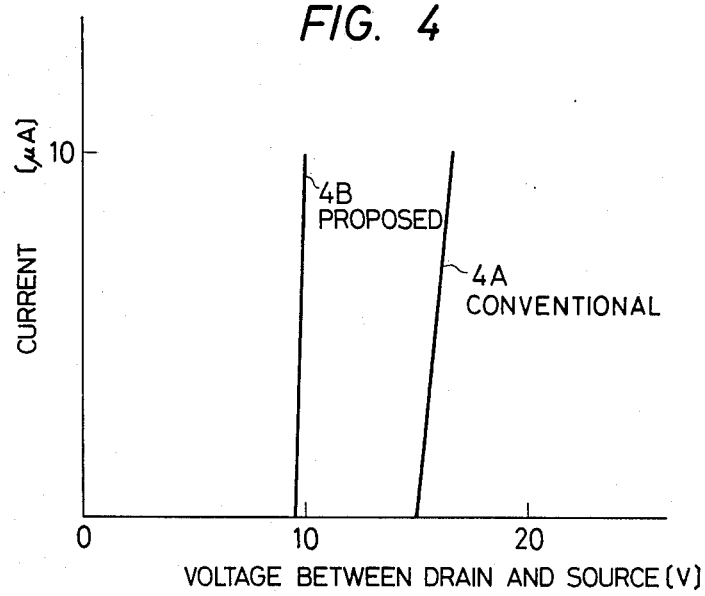
FIG. 4 is a diagram showing the breakdown characteristics of an MOS transistor.

FIG. 4 shows the characteristics of surface breakdown of the two MOS transistors 43 (FIGS. 2 and 3) formed inside the p-type well represented by 35 or 36 and inside the p-type well represented by 50, respectively. In the diagram, 4A (CONVENTIONAL) represents the breakdown characteristics of the MOS transistor 43 (FIG. 2) formed inside the conventional p-type well 35 or 36, and 4B (PROPOSED) represents the breakdown characteristics of the MOS transistor 43 formed inside the p-type well 50 in accordance with the present invention.

As can be seen clearly from the diagram, the surface breakdown voltage of the MOS transistor in accordance with the present invention exhibits a voltage drop of at least 5 V in comparison with the conventional transistor, and the value of the internal resistance becomes extremely small due to the rise characteristics of the current characteristics.

Figure 5:
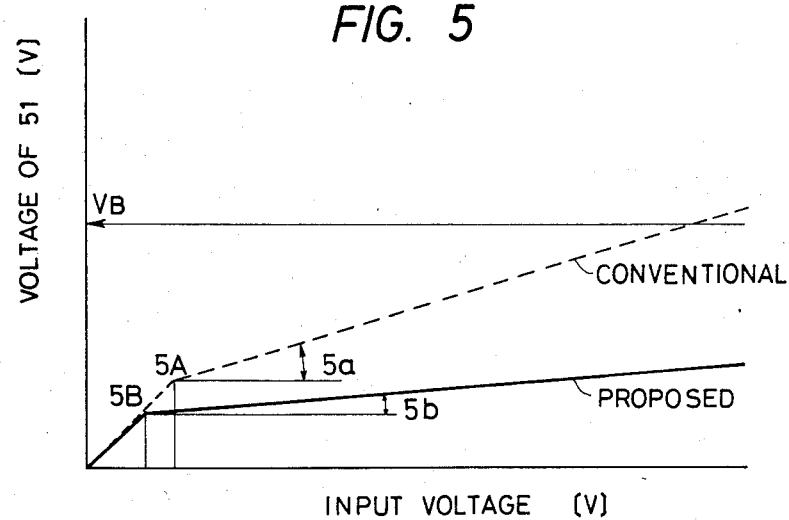
FIG. 5 is a diagram showing the relation between an input terminal voltage and a voltage of an internal terminal.

FIG. 5 shows the withstand voltage of the transistor with respect to the input voltage, and is a modification of FIG. 4. FIG. 5 shows the relation between the input voltage and the output voltage (51 in FIG. 3) through the protection circuit (with the clamp resistance being as shown in FIG. 2). The voltage of 51 is proportional to the input voltage until the MOS transistor 43 undergoes breakdown, but after the breakdown, it rises at a ratio of the resistances between the clamp resistance and the internal resistance of breakdown.

In accordance with the prior art, the breakdown voltage value (at point 5A) as well as the internal resistance value after the breakdown are high, so that the gradient with respect to the input terminal voltage is also high (5a). In the semiconductor device of the present invention, on the other hand, the breakdown voltage value is small (5B) and the internal resistance is also small (5b), so that the value of the input terminal voltage before the voltage $V_B$ at which the gate oxide film of the active circuit undergoes breakdown, can be drastically increased when compared with the prior art devices.

The effect of the present invention described above means also the following. As described above, the value of the input terminal voltage before the voltage $V_B$, at which the gate oxide film of the active circuit undergoes breakdown, has a sufficiently large margin in comparison with the prior art, so that the value of the input clamp resistance can be further reduced. Needless to say, this provides the advantage for ICs and LSIs of shorter delay time.

EMBODIMENT 2

Figure 6:
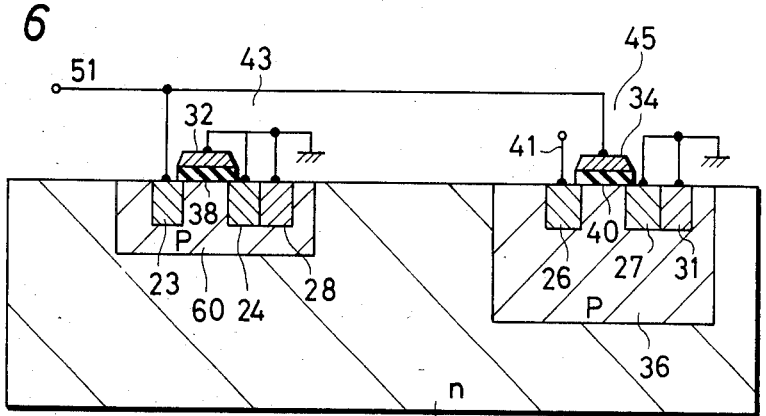
FIG. 6 is a cross-sectional view of a second embodiment of the present invention.

FIG. 6 shows the sectional structure of the semiconductor device in accordance with the second embodiment of the present invention. In the drawing, the MOS transistor 43 is shown formed inside a p-type well 60 whose carrier concentration is by about five to ten times higher than that of the p-type well 36 forming the active MOS transistor 45 and whose depth is smaller than the latter. In the present invention, the well 36 is at least 3 μm whereas the well 60 is up to 3 μm, for example, and this embodiment provides the same effect as that of the first embodiment shown in FIG. 3. Moreover, this embodiment provides the following effect.

Because the p-type well 60 is shallow, the p-type well region below the N+diffusion layer 23 is completely depleted and so-called "punch-through" occurs when the voltage of the internal terminal 51, that is, the terminal voltage of the N+diffusion layer 23, reaches a predetermined voltage with the n-type substrate 37 being at the ground potential. When this punch-through takes place, the charge stored in the N+diffusion layer 23 flows to the substrate 37, with the result that the voltage rise of 51 is limited and the value of the breakdown voltage of the gate oxide film as viewed from the input terminal can be improved.

It is obvious in the present invention that the lower the resistance of the n-type substrate 37, the greater the protection capability, and hence an N−/N+epitaxial substrate is preferably used as the substrate 37. In this case, a greater effect could be obtained with a thinner N−layer forming the MOS transistor, and the N+layer, too, is preferably kept fixed at a predetermined determinal potential from the reverse of the substrate through a metal.

In this embodiment, the carrier concentration of the p-type well 60 is increased and its depth is reduced, but the effect of the present invention can be obtained by reducing the depth of the well even when the concentration is the same.

EMBODIMENT 3

Figure 7:
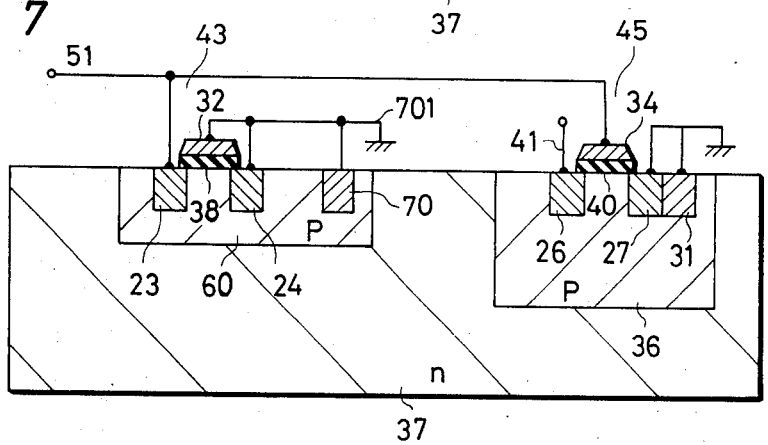
FIG. 7 is a cross-sectional view of a third embodiment of the present invention.

FIG. 7 shows the cross-sectional structure of a semiconductor device in accordance with the third embodiment of the present invention. The improvement of this embodiment over the first and second embodiments described above is that a p-type impurity layer 70 for keeping a p-type well 60 fixed at the ground potential is sufficiently spaced apart from layers forming a MOS transistor 43, such as a drain 23 and a source 24, for example. In other words, the member represented by reference numeral 70 is spaced apart from the member represented by reference numeral 24. More definitely, it is preferably spaced apart in a distance exceeding the depths of the drain 23 and source 24.

In accordance with this embodiment, when the MOS transistor 43 undergoes breakdown, the holes are injected into the p-type well 60 and slightly raises the potential under the MOS transistor gate 32, so that an NPN bipolar transistor using the n-type impurity layer 23 as the collector, the well 60 as the base and the n-type impurity layer 24 as the emitter is created. As a result, a large current can be caused to flow from 51 to the ground 701 through the bulk below the surface of the MOS transistor, and the protection effect can be further increased.

EMBODIMENT 4

Figure 8:
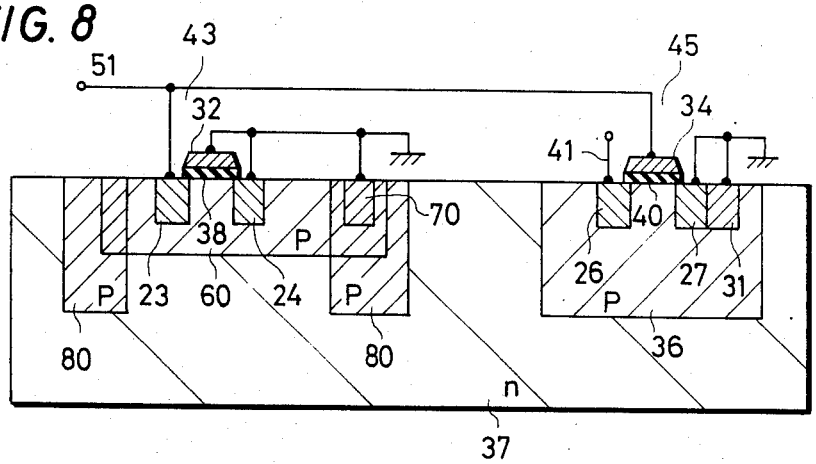
FIG. 8 is a cross-sectional view of a fourth embodiment of the present invention.

FIG. 8 shows the cross-sectional structure of a semiconductor device in accordance with the fourth embodiment of the present invention. In addition to the third embodiment shown in FIG. 7, this embodiment disposes a p-type well 80 which is analogous to the p-type well 36 forming the internal circuit. This embodiment provides the same effect as the third embodiment described above in the respect of the protection function of the breakdown of the internal gate, but in this embodiment, good immunity to a latch-up phenomenon (or thyristor effect), which occurs during normal operation and is inherent to the CMOS structure, can be obtained.

Assuming now that p- and n-type diffusion layers connected to the supply voltage or ground (e.g., 42, 31 in FIG. 2) exist in the proximity of the MOS transistor having the protection function, then the current gain of a vertical n-p-n bipolar transistor is great because the depth of the p-type well 60 is small, and latch-up occurs easily due to noise current applied from the p- or n-type impurity layer connected to the output node 41 in FIG. 8 or 30 in FIG. 2, or due to a noise current injected into the p-type well 60 from the terminal of 51. Since the deep p-type well 80 encompasses the device 43 in this embodiment, the noise current thus injected is collected by the well 80 and hence latch-up is less likely to occur.

Figure 9:
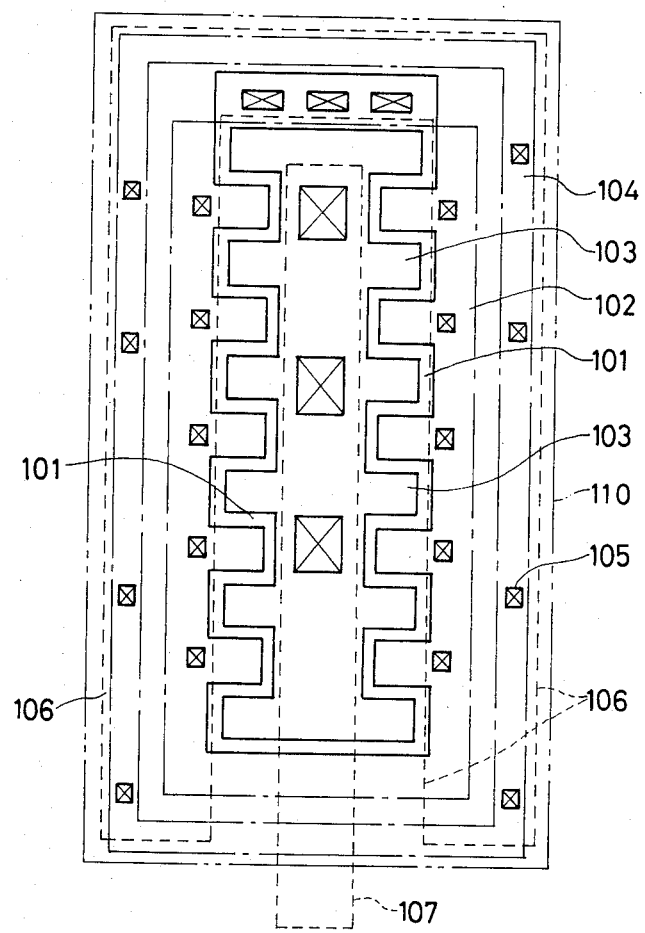
FIG. 9 is a plan view of the fourth embodiment of the present invention.

FIG. 9 shows the pattern layout of the semiconductor device in accordance with the third embodiment of the present invention. In the drawing, reference numeral 107 represents the input terminal, which is an aluminum layer corresponding to the member 51 in FIG. 7. Reference numeral 106 represents a ground terminal which is also an aluminum layer, and reference numerals 102 and 103 represent n-type diffusion layer regions which are source and drain, respectively. Reference numeral 101 represents a region which is to serve as the gate of an MOS transistor, and consists of a polysilicon layer, a silicide layer or a metal layer or a composite layer of them. Reference numeral 104 represents a p-type diffusion layer-forming region, which keeps a p-type well region 110 fixed at the ground potential. Reference numeral 105 represents a through-hole portion for connecting the diffusion layer or the gate layer. The gate layer has a large number of rectangular shapes so as to cause a large current to flow with a limited area. (The current can be increased by expanding the channel width.)

Consideration should be made so that as many through-hole portions as possible are disposed also within the regions 103 and 102 to minimize the resistance of the diffusion layer. When the p-type well 80 shown in FIG. 8 is employed, a predetermined layer is disposed outside 110 so as to expand the p-type diffusion layer or a p-type diffusion region is separately disposed to keep it at the ground potential.

EMBODIMENT 5

Figure 10:
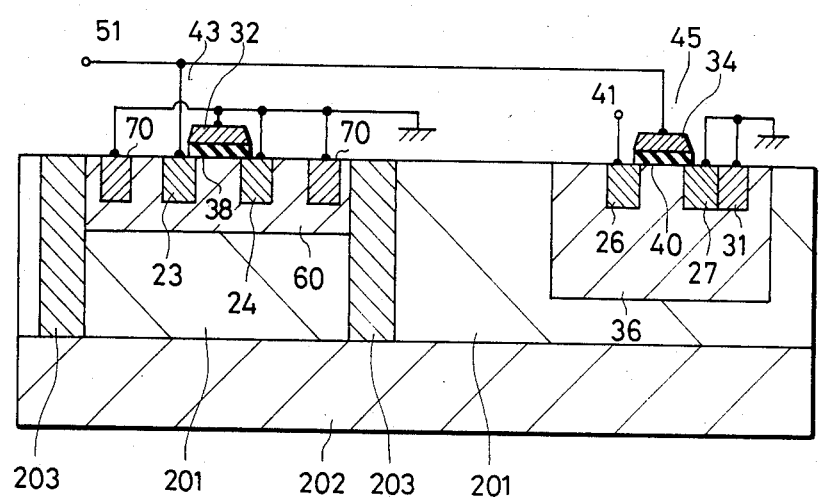
FIG. 10 is a cross-sectional view of a fifth embodiment of the present invention.

FIG. 10 shows the cross-sectional structure of a semiconductor device in accordance with the fifth embodiment of the present invention. In addition to the third embodiment shown in FIG. 7, this embodiment employs a structure in which a deep isolation 203 encompasses the protection circuit portion. Reference numeral 201 in the drawing represents an n-type semiconductor layer, and 202 is an n+-type semiconductor layer having a lower resistance than that of the semiconductor layer 201. This embodiment can completely prevent the latch-up phonemenon inherent to the CMOS structure described with reference to FIG. 8, and a protection circuit very resistant to external noise can be obtained. An n+- or p-type diffusion layer, an insulator layer such as $SiO_2$, a polysilicon layer, or the like, is used as the deep isolation 203.

Effect of the Invention

As described above, the present invention can provide a protection device which can eliminate the problems with the prior art. In the embodiments of the invention described above, the input clamp resistance is not discussed, in particular, but it is obvious that the protection effect can be further improved by jointly using the input clamp resistance with the semiconductor device of the invention. The resistance material in this case may be the same that is used for the gate of the MOS transistor, and may be simultaneously formed with the gate. Alternatively, it may be a material that is different from that of the gate.

Of course the effect of the invention can be obtained also when the conductivity types of the impurities and semiconductor substrate are reversed.

What is claimed is:

1. A semiconductor device comprising:
    a semiconductor substrate of a first conductivity type;
    a first impurity region of a second conductivity type formed at a first predetermined portion of said semiconductor substrate;
    a first insulated gate field effect transistor formed inside said first impurity region;
    a second insulated gate field effect transistor formed at a second predetermined portion of said semiconductor substrate;
    a second impurity region of the second conductivity type, having a concentration higher than that of said first impurity region, and formed at a third preddetermined portion of said semiconductor substrate;
    a third insulated gate field effect transistor having a source and drain thereof comprised of third impurity regions of the first conductivity type, and disposed inside said second impurity region; and
    a fourth impurity region of the second conductivity type, disposed inside said second impurity region, and connected electrically to the source and gate of said third insulated gate field effect transistor, and kept fixed at a ground potential,
    wherein the drain of said third insulated gate field effect transistor is connected to a gate of at least one of said first and second insulated gate field effect transistors to serve as a protection transistor for preventing destruction of the gate of said at least one transistor that it is connected to.

2. The semiconductor device as defined in claim 1 wherein said drain is connected to a terminal which is in turn connected to the exterior of said substrate through a resistance.

3. The semiconductor device as defined in claim 1 wherein the depth of said second impurity region is smaller than that of said first impurity region.

4. The semiconductor device as defined in claim 1 wherein said fourth impurity region is spaced apart from the third impurity regions of said third insulated gate field effect transistor, to form a bipolar transistor in conjunction with the source and drain of said third insulated gate field effect transistor and said second impurity region.

5. The semiconductor device as defined in claim 1 wherein a fifth impurity region having the same conductivity type, the same concentration and the same depth as those of said first impurity region is formed at a predetermined portion of said second impurity region.

6. The semiconductor device as defined in claim 1 wherein an isolation impurity region of the second conductivity type is disposed so as to encompass said second impurity region.

* * * * *